(12) United States Patent
Park et al.

(10) Patent No.: US 6,663,944 B2
(45) Date of Patent: Dec. 16, 2003

(54) TEXTURED SEMICONDUCTOR WAFER FOR SOLAR CELL

(75) Inventors: Sang-Wook Park, Sungnam (KR); Dong-Seop Kim, Seoul (KR); Soo-Hong Lee, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 52 days.

(21) Appl. No.: 09/992,002

(22) Filed: Nov. 26, 2001

(65) Prior Publication Data

US 2002/0119290 A1 Aug. 29, 2002

(30) Foreign Application Priority Data

Jan. 3, 2001 (KR) .............................................. 2001-251

(51) Int. Cl.$^7$ .............................. B32B 3/00; H01L 31/00; B44C 1/22
(52) U.S. Cl. ..................... 428/156; 428/167; 216/99; 136/256
(58) Field of Search ................................. 428/167, 156, 428/913; 136/244, 246, 249, 256; 126/621, 623, 624, 625; 216/99; 204/192, 37

(56) References Cited

U.S. PATENT DOCUMENTS

| | | | | |
|---|---|---|---|---|
| 4,916,503 A | * | 4/1990 | Uematsu et al. | ............... 357/30 |
| 5,258,077 A | * | 11/1993 | Shahryar et al. | ............. 136/256 |
| 5,804,090 A | | 9/1998 | Iwasaki et al. | |
| 5,949,123 A | | 9/1999 | Le et al. | |
| 5,997,990 A | * | 12/1999 | Kambara et al. | ........... 428/167 |

* cited by examiner

*Primary Examiner*—Donald J. Loney
(74) *Attorney, Agent, or Firm*—Robert E. Bushnell, Esq.

(57) ABSTRACT

A textured semiconductor wafer for a solar cell includes a plurality of grooves being formed on a surface of the semiconductor wafer. The grooves are formed in the step of depositing a protector in the form of islands on the surface by spray process or screen-printing process, dipping the wafer into an isotropic etching solution to etch a portion of the surface where the protector is not deposited, and removing the protector.

18 Claims, 3 Drawing Sheets

TEXTURED SEMICONDUCTOR WAFER FOR SOLAR CELL

CLAIM OF PRIORITY

This application makes reference to, incorporates the same herein, and claims all benefits accruing under 35 U.S.C. §119 from an application for METHOD OF TEXTURING SEMICONDUCTOR SUBSTRATE FOR SOLAR CELL earlier filed in the Korean Industrial Property Office on Jan. 3, 2001 and there duly assigned Serial No. 2001-251.

BACKGROUND OF THE INVENTION

1. Field of the Invention

The present invention relates to a solar cell and more particularly a textured semiconductor wafer for a solar cell.

2. Description of the Related Art

A solar cell includes a junction of a p-type semiconductor and an n-type semiconductor (pn junction). In the cell, electron-hole pairs are generated by photon. The generated electrons and holes respectively move toward the p-type and n-type semiconductors, and then accumulated in two contacts. When light shining on the solar cell produces both a current and a voltage, the light-generated current and voltage can be used as electric power.

A performance of such a solar cell depends on the conversion efficiency from light energy into electric energy. The conversion efficiency is represented as a ratio of electric output of the solar cell to an amount of incident light.

Accordingly, a variety of solar cells have been developed to improve the conversion efficiency. As an example, a method for maximizing the light absorption by texturing the surface of a solar cell wafer has been proposed. To texture the surface of the wafer, various methods such as chemical etching, plasma etching, mechanical scribing, and photolithography have been used.

Particularly, the chemical etching is widely used as it has an advantage that a lot of wafers can be quickly textured with less expenses. An isotropic etching and anisotropic etching are well known as the chemical etching.

U.S. Pat. No. 5,949,123 issued to Le et al. for Solar Cell Including Multi-crystalline Silicon and a Method of Texturizing the Surface of P-type Multi-crystalline Silicon, discloses such isotropic etching for texturing polycrystalline silicon wafer using oxidizing solution having fluorine ions. FIG. 4 is a schematic view of the polycrystalline silicon wafer surface 10 textured according to this method and illustrates a path of the incident light 20 to the textured surface 10. However, a polycrystalline silicon wafer surface textured according to this method is designed to deteriorate the light absorption efficiency as light cannot bound more than two times at the textured surface.

U.S. Pat. No. 5,804,090 issued to Iwasaki et al for Process for Etching Semiconductors Using a Hydrazine and Metal Hydroxide-containing Etching Solution discloses such anisotropic etching, in which hydrazine hydrate functioning as a protector and metal hydroxide solution as etching solution are used. This anisotropic etching is very effective for a single crystalline silicon wafer, but has an identical problem to the isotropic etching for a polycrystalline silicon wafer.

In addition, the mechanical scribing, plasma etching, and photolithography are all time consuming and costly.

Therefore, there is a need for chemical etching that can effectively texture the surface of the polycrystalline silicon wafer.

SUMMARY OF THE INVENTION

It is therefore an objective of the present invention to provide a textured polycrystalline silicon wafer and a single crystalline silicon wafer with less expense, while improved light absorption efficiency.

To achieve the above and other objectives, the present invention provides a textured semiconductor wafer for a solar cell. The textured semiconductor wafer includes a plurality of grooves being formed on a surface of the semiconductor wafer. The grooves are formed in the step of depositing a protector on the surface randomly by spray process or screen-printing process, dipping the wafer into an isotropic etching solution to etch a portion of the surface where the protector is not deposited, and removing the protector. Particularly, when using the spray process, the protector is deposited on a surface of the wafer at the random distribution.

A shape of the groove is concaved to make the incident light bound the surface more than one time.

The semiconductor wafer is silicon wafer.

The protector is deposited on more than 90% of an entire area of the surface.

The protector is formed of organic or inorganic material that does not reacts with etching solution but can be easily deposited and removed, and endure an annealing process. Preferably, the protector is formed of a material selected from the group including photoresist, silicon oxide, $TiO_2$, and $NaNO_2$.

The isotropic etching solution is an acid-based solution. Preferable, the isotropic etching solution is selected from the group including HF, $HNO_3$, a mixture of HF and $HNO_3$, phosphoric acid, acetic acid, a mixture of phosphoric acid and water, and a mixture of acetic acid and water.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1A:
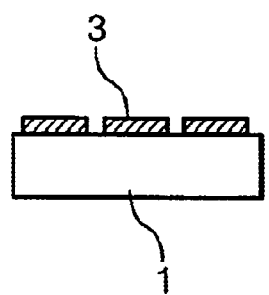
FIGS. 1a to 1c are schematic views illustrating a texturing process according to a preferred embodiment of the present invention.
Figure 1B:
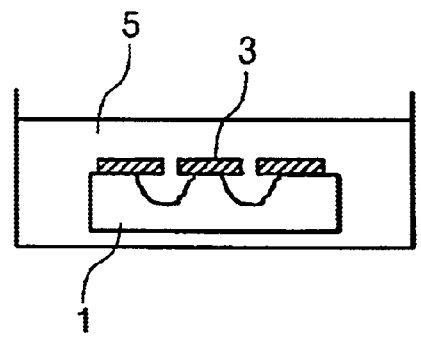
Figure 1C:
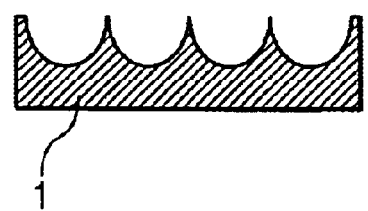

Turning now to the drawings, FIGS. 1a to 1c show a texturing process for fabricating a semiconductor wafer for a solar cell according to a preferred embodiment of the present invention.

Generally, a texturing process is performed to make a surface of a wafer uneven so that light can bound more than one time at the surface to reduce the light reflection rate and increase the light absorption rate.

That is, as shown in FIG. 1a, a protector 3 is first formed on portions of a wafer 1 through a spray or screen-printing process.

When the protector 3 is deposited through the spray or screen-printing process, the protector 3 is formed on the wafer surface in the form of islands. Particularly, when using the spray process, the protector is deposited on a surface of the wafer at the random distribution.

In the spray process, a protector solution is sprayed on the wafer surface through a nozzle together with carrier gas such as $N_2$, $O_2$ or air. A viscosity of the protector solution and the gas flow rate are controlled to make protector islands, and a nozzle size and a distance between the nozzle and the wafer surface are controlled by the kind of the protector.

The spray process is performed until the protector is deposited on more than 90% of an entire area of the wafer surface. If the deposited area is less than 90%, the light reflection rate of the textured semiconductor wafer cannot be sufficiently reduced.

Figure 2:
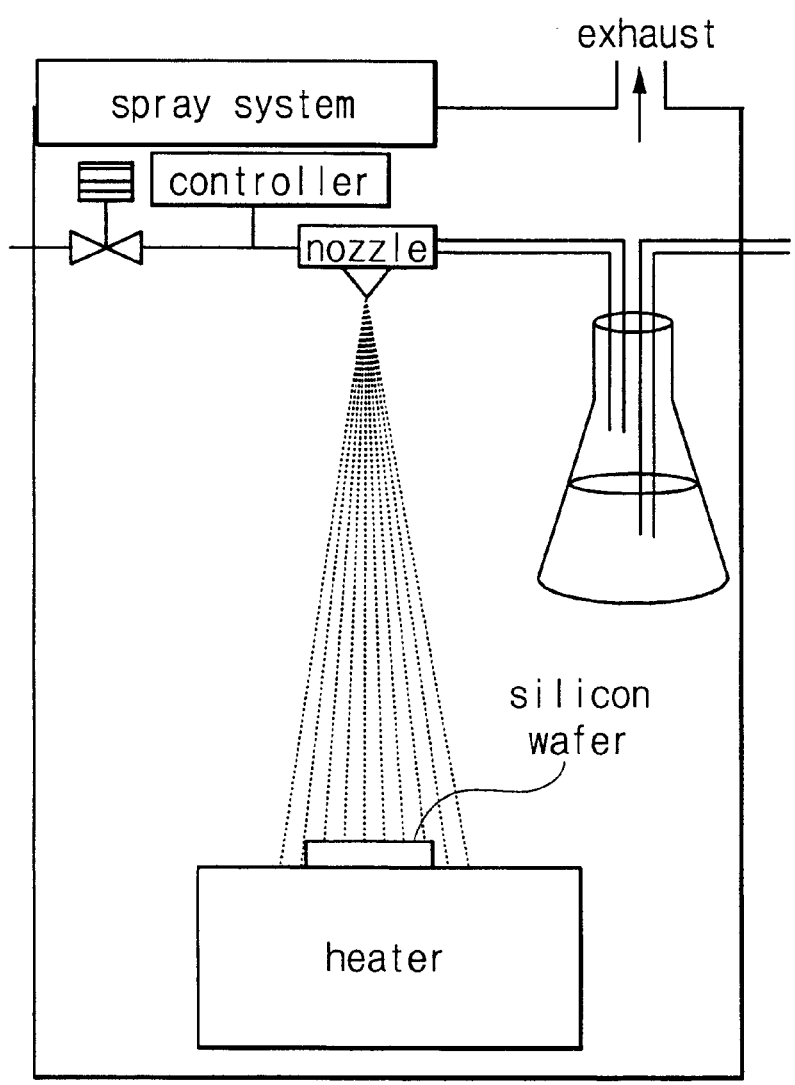
FIG. 2 is a schematic view illustrating a spray system that can be employed for a texturing process according to a preferred embodiment of the present invention.

A dry process can be performed simultaneously with or after the spray process to remove the solvent from the protector solution. When the dry process and the spray process are performed simultaneously, the productivity can be improved and a spray system shown in FIG. 2 can be used. Since the solvent is removed from the protector solution by the dry process, only the protector material remains on the semiconductor wafer surface after the dry process.

When the screen-printing process is used, the protector solution is also deposited on the wafer in the form of islands. The viscosity of the solution is controlled to make the protector islands. A dry process is performed after the screen-printing process is performed to remove the solvent from the protector solution so that only the protector material remains on the semiconductor wafer surface. The screen-printing process is also performed such that the deposited area occupies more than 90% of the entire area of the semiconductor wafer.

As the solvent for dissolving the protector material, alcohol-based material such as methanol and ethanol that can be volatilized during the dry process may be preferably used.

As the protector material, organic or inorganic material that does not react with etching solution but can be easily deposited and removed, and endure an annealing process may be preferably used. For example, photoresist, silicon oxide, $TiO_2$, or $NaNO_2$ may be preferably used as the protector material.

After the protector 3 is formed, as shown in FIG. 1b, the semiconductor wafer 1 is dipped into isotropic etching solution 5. At this point, a portion of the wafer surface where the protector is not deposited is etched by the isotropic etching solution. The dipping time is preferably about 1–10 minutes. When the dipping time is over 10 minutes, the wafer is over-etched to increase the reflection rate.

As material for the isotropic etching solution, HF, $HNO_3$, a mixture of HF and $HNO_3$, phosphoric acid, acetic acid, a mixture of phosphoric acid and water, and a mixture of acetic acid and water, at a predetermined ratio of the mixture, may be used.

After the above, the protector is removed so as to obtain a wafer 1 as shown in FIG. 1c.

Figure 3:
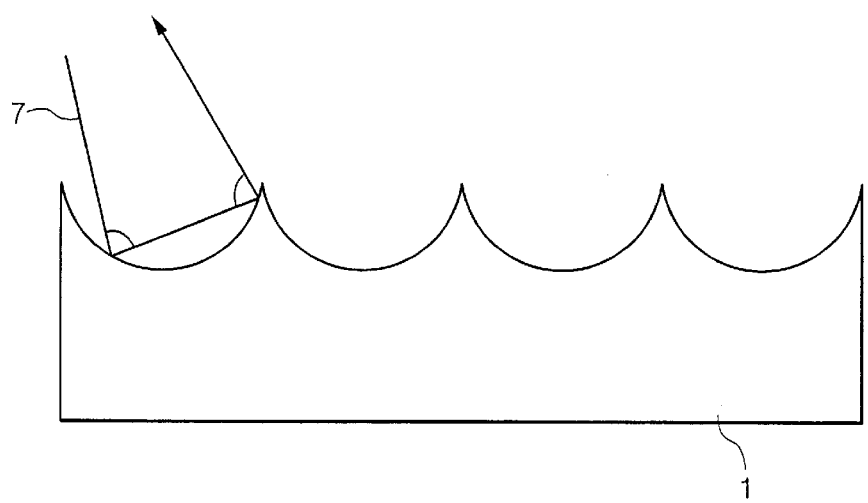
FIG. 3 is a schematic view illustrating a path of incident light to a textured surface according to the present invention.
Figure 4:
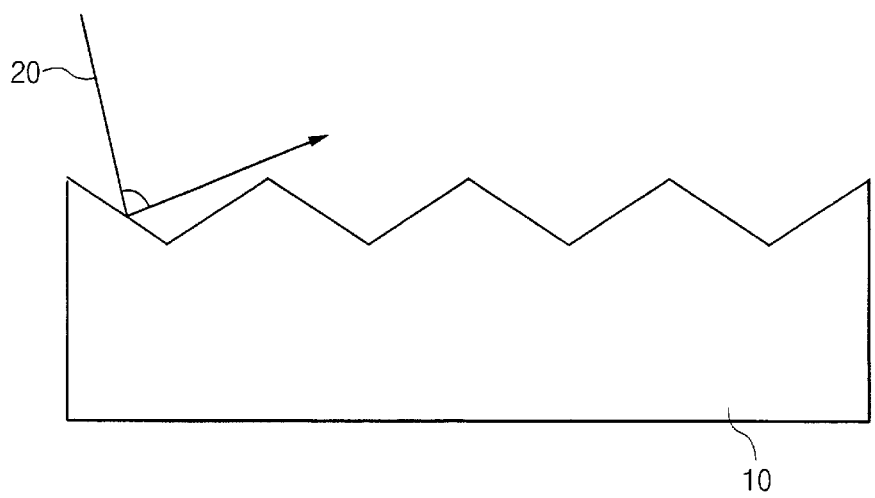
FIG. 4 is a schematic view illustrating a path of incident light to a textured surface according to the related art.

As described above, the texturing process is performed by a spray or screen-printing process and an isotropic etching process, the process is simplified and the costs can be saved. Furthermore, in the inventive textured surface, a plurality of grooves are formed, and the shape of the groove is concaved to make the incident light bound more than one time as shown in FIG. 3 illustrating a path of incident light 7 to a textured surface 1, and the light reflection rate is reduced to improve the light conversion efficiency.

A variety of examples and comparative examples will be described hereinafter.

EXAMPLE 1

A single crystalline silicon wafer was prepared and a photoresist solution (Trademark: AZ7220, Manufacturer: Hoechst) was sprayed on the wafer surface using a spray system depicted in FIG. 2, whereby the photoresist was randomly deposited on the wafer in the form of islands.

Then, the wafer deposited with the photoresist was dipped into an isotropic etching solution, which is a mixture solution of HF and HNO having the volume ratio of 1:40, for 10 minutes so as to etch portions of the wafer surface where the phororesist is not deposited.

After the above, the photoresist was removed from the wafer to obtain a textured wafer for a solar cell.

EXAMPLE 2

Example 2 was performed in the identical process as that of Example 1 except that a polycrystalline silicon wafer was used instead of using the single crystalline silicon wafer.

COMPARATIVE EXAMPLE 1

A single crystalline silicon wafer was dipped into an isotropic etching solution, which is a mixture solution of HF, $HNO_3$ and $H_3PO_4$, having the volume ratio of 12:1:12 as the mixture ratio, for 2 minutes, thereby obtaining a textured wafer.

COMPARATIVE EXAMPLE 2

A single crystalline silicon wafer was dipped into an isotropic etching solution, which is a mixture solution of KOH and isopropyl alcohol, for 20 minutes, thereby obtaining a textured wafer.

COMPARATIVE EXAMPLE 3

A polycrystalline silicon wafer was dipped into an isotropic etching solution, which is a mixture solution of KOH and isopropyl alcohol, for 20 minutes, thereby obtaining a textured wafer.

COMPARATIVE EXAMPLE 4

A single crystalline silicon wafer was prepared and an oxide layer was formed on the wafer surface through an oxidation process. The oxide layer was patterned through a photolithography process such that a portion of the wafer surface is exposed. The exposed portion of the wafer surface was etched using a KOH solution, and then the oxide layer was removed, thereby obtaining a textured wafer.

COMPARATIVE EXAMPLE 5

A polycrystalline silicon wafer was prepared and an oxide layer was formed on the surface of the wafer through an oxidation process. The oxide layer was patterned through a photolithography process such that a portion of the wafer surface is exposed. The exposed portion of the polycrystalline silicon wafer was etched using an anisotropic etching solution, and then the oxide layer was removed, thereby obtaining a textured wafer.

A reflection rate of the textured wafers of Examples 1 and 2 and Comparative Examples 1 to 5 was measured, and the results are shown in the following Table 1.

TABLE 1

|  | Reflection Rate |
| --- | --- |
| Example 1 | 9 |
| Example 2 | 9 |
| Comparative Example 1 | 22.4 |
| Comparative Example 2 | 29 |
| Comparative Example 3 | 12 |
| Comparative Example 4 | 11 |
| Comparative Example 5 | 18 |

As shown in Table 1, it is noted that the reflection rates of a wafer fabricated under Examples 1 and 2 according to the present invention are lower than those of a wafer made under Comparative Examples 1 to 5. That is, the efficiency of the solar cell fabricated according to the present invention is higher than that of the conventional one.

As described above, in the present invention, since the solar cell wafer is textured after depositing the protector through the simple spray or screen printing process, while lowering the light reflection rate, the manufacturing costs is reduced and the light efficiency is improved.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor wafer for a solar cell, comprising a plurality of grooves randomly formed on a surface of the semiconductor wafer of the solar cell, the grooves being formed by depositing a protector on the surface randomly, dipping the wafer into an isotropic etching solution to etch a portion of the surface where the protector is not deposited, and removing the protector.

2. A semiconductor wafer of claim 1, further comprised of the protector being deposited by any one of a spray process and a screen-printing process.

3. A semiconductor wafer of claim 1, further comprised of a shape of the groove being concaved to make the incident light bound the surface more than one time.

4. A semiconductor wafer of claim 1, further comprised of the semiconductor wafer being a silicon wafer.

5. A semiconductor wafer of claim 1, with the protector being deposited on more than 90% of an entire area of the surface.

6. A semiconductor wafer of claim 1, further comprised of the protector being formed of organic or inorganic material being not reactive with etching solution and can be deposited and removed, and endure an annealing process.

7. A semiconductor wafer of claim 1, further comprised of the protector being formed of a material selected from the group consisting of photoresist, silicon oxide, $TiO_2$, and $NaNO_2$.

8. A semiconductor wafer of claim 1, with the isotropic etching solution being an acid-based solution.

9. A semiconductor wafer of claim 8, further comprised of the isotropic etching solution being selected from the group consisting of HF, $HNO_3$, a mixture of HF and $HNO_3$, phosphoric acid, acetic acid, a mixture of phosphoric acid and water, and a mixture of acetic acid and water.

10. A method of making a semiconductor wafer for a solar cell, comprising:

forming a plurality of grooves randomly on a surface of the semiconductor wafer, the grooves being formed by the method comprising of:
depositing a protector on the surface randomly;
dipping the wafer into an isotropic etching solution to etch a portion of the surface where the protector is not deposited; and
removing the protector.

11. The method of claim 10, further comprised of the protector being deposited by any one of a spray process and a screen-printing process.

12. The method of claim 10, further comprised of a shape of the groove being formed concave to make the incident light bound the surface more than one time.

13. The method of claim 10, further comprised of the semiconductor wafer being a silicon wafer.

14. The method of claim 10, with the protector being deposited on more than 90% of an entire area of the surface.

15. The method of claim 10, further comprised of the protector being formed of organic or inorganic material being not reactive with etching solution and can be deposited and removed, and endure an annealing process.

16. The method of claim 10, further comprised of the protector being formed of a material selected from the group consisting of photoresist, silicon oxide, $TiO_2$, and $NaNO_2$.

17. The method of claim 10, with the isotropic etching solution being an acid-based solution.

18. The method of claim 17, further comprised of the isotropic etching solution being selected from the group consisting of HF, $HNO_3$, a mixture of HF and $HNO_3$, phosphoric acid, acetic acid, a mixture of phosphoric acid and water, and a mixture of acetic acid and water.

* * * * *